US012573985B2

(12) United States Patent
Chen et al.

(10) Patent No.: US 12,573,985 B2
(45) Date of Patent: Mar. 10, 2026

(54) AMPLIFIER CIRCUIT

(71) Applicant: RichWave Technology Corp., Taipei City (TW)

(72) Inventors: Chih-Sheng Chen, Taipei City (TW); Hung-Chia Lo, Taipei City (TW); Chia-Jung Yeh, Taipei City (TW)

(73) Assignee: RichWave Technology Corp., Taipei City (TW)

( * ) Notice: Subject to any disclaimer, the term of this patent is extended or adjusted under 35 U.S.C. 154(b) by 550 days.

(21) Appl. No.: 18/084,569

(22) Filed: Dec. 20, 2022

(65) Prior Publication Data

US 2023/0246600 A1 Aug. 3, 2023

(30) Foreign Application Priority Data

Jan. 28, 2022 (TW) ................................. 111104021

(51) Int. Cl.
*H03F 1/30* (2006.01)
*H03F 3/04* (2006.01)
(52) U.S. Cl.
CPC ............... *H03F 1/302* (2013.01); *H03F 3/04* (2013.01); *H03F 2200/129* (2013.01)
(58) Field of Classification Search
CPC ...... H03F 1/302; H03F 3/04; H03F 2200/129; H03F 2200/451; H03F 3/19; H03F 2200/18; H03F 1/30; H03F 3/21; H03G 3/30
USPC ......................................... 330/291, 296, 285
See application file for complete search history.

(56) References Cited

U.S. PATENT DOCUMENTS 6,731,171 B2 * 5/2004 Yamashita .............. H03F 3/345
330/285
2012/0235750 A1 * 9/2012 Granger-Jones ........ H03F 1/302
330/296
2018/0145641 A1 5/2018 Schleicher

OTHER PUBLICATIONS

Office action mailed on Sep. 2, 2022 for the Taiwan application No. 111104021, filing date Jan. 28, 2022, pp. 1-7.

* cited by examiner

*Primary Examiner* — Andrea Lindgren Baltzell
*Assistant Examiner* — Khiem D Nguyen
(74) *Attorney, Agent, or Firm* — Winston Hsu

(57) ABSTRACT

An amplifier circuit includes an amplifier, a detector and an adjustment circuit. The amplifier includes a first transistor and a bias voltage terminal. The first transistor includes a first terminal coupled to a first reference voltage terminal, a second terminal coupled to a second reference voltage terminal, and a control terminal coupled to the bias voltage terminal of the amplifier. The second transistor includes a first terminal coupled to a third reference voltage terminal and the detector, and a second terminal coupled to the second reference voltage terminal. The detector outputs a detection signal related to a characteristic parameter of the second transistor. The adjustment circuit is coupled to the detector and the bias voltage terminal of the amplifier for performing an adjustment operation according to the detection signal.

15 Claims, 8 Drawing Sheets

AMPLIFIER CIRCUIT

TECHNICAL FIELD

The disclosure is related to an amplifier circuit, and more particularly, an amplifier circuit including an amplifier and a detector where the characteristic parameters of the transistors in the amplifier and the detector are related to one another.

BACKGROUND

In the semiconductor process, process variation may cause variations of the characteristic parameters of the transistors in the amplifier. As a result, the performance of the amplifier is affected, and the gain of the amplifier is inaccurate.

SUMMARY

An embodiment provides an amplifier circuit comprising an amplifier, a detector and an adjustment circuit. The amplifier comprises a bias node and a first transistor, where the first transistor can comprise a first terminal coupled to a first reference voltage terminal, a second terminal coupled to a second reference voltage terminal, and a control terminal coupled to the bias node of the amplifier. The detector can comprise an output terminal and a second transistor, where the output terminal can be configured to output a detection signal related to a characteristic parameter of the second transistor, and the second transistor can comprise a first terminal coupled to a third reference voltage terminal and the output terminal of the detector, and a second terminal coupled to the second reference voltage terminal. The adjustment circuit can be coupled to the output terminal of the detector and the bias node of the amplifier, and can be configured to perform an adjustment operation according to the detection signal. The first transistor and the second transistor can be disposed in a same integrated circuit. The first transistor and the second transistor can be of a same type, and the characteristic parameter of the second transistor can be related to a characteristic parameter of the first transistor.

Another embodiment provides an amplifier circuit comprising an amplifier, a detector and an adjustment circuit. The amplifier can comprise a bias node and a transistor, where the transistor can comprise a first terminal coupled to a first reference voltage terminal, a second terminal coupled to a second reference voltage terminal, and a control terminal coupled to the bias node of the amplifier. The detector can comprise an output terminal and a semiconductor element, where the output terminal can be configured to output a detection signal, and the semiconductor element can comprise a first terminal coupled to a third reference voltage terminal, and a second terminal coupled to the second reference voltage terminal. The detection signal can be related to a characteristic parameter of the semiconductor element. The adjustment circuit can be coupled to the output terminal of the detector and the bias node of the amplifier, and can be configured to perform an adjustment operation according to the detection signal. The transistor and the semiconductor element can be disposed in a same integrated circuit. The transistor and the semiconductor element have at least one same semiconductor layer, and the characteristic parameter of the semiconductor element can be related to a characteristic parameter of the transistor.

DETAILED DESCRIPTION

Figure 1:
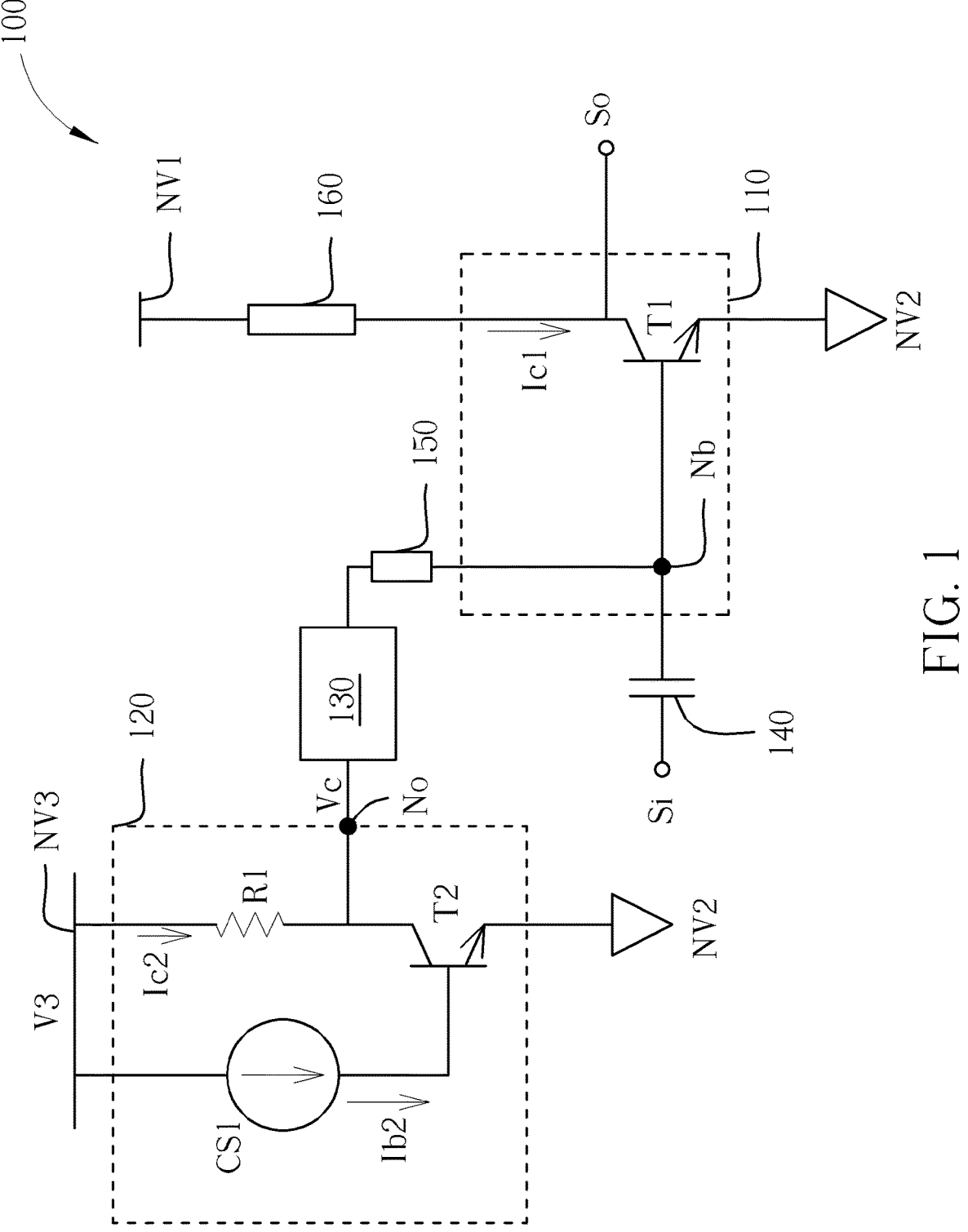
FIG. 1 illustrates an amplifier circuit according to an embodiment.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 illustrates an amplifier circuit 100 according to an embodiment. The amplifier circuit 100 can include an amplifier 110 including a transistor T1 and a bias node Nb. The transistor T1 can include a first terminal, a second terminal and a control terminal, where the first terminal can be coupled to a reference voltage terminal NV1, the second terminal can be coupled to a reference voltage terminal NV2, and the control terminal can be coupled to the bias node Nb of the amplifier 110. In addition, the control terminal of the transistor T1 can be further coupled to an input terminal of the amplifier 110, and the first terminal of the transistor T1 can be further coupled to an output terminal of the amplifier 110. The amplifier 110 can be a power amplifier or an amplifier of another type. The amplifier 110 can be used to amplify an input signal Si received by the input terminal to output an output signal So from the output terminal. For example, the input signal Si and the output signal So can be radio frequency (RF) signals.

According to an embodiment, when the transistor T1 is a bipolar junction transistor (BJT), the first terminal, second terminal and control terminal of the transistor T1 can be a collector terminal, an emitter terminal and a base terminal respectively, and a characteristic parameter of the transistor T1 can include a common-emitter current gain parameter (a.k.a. $\beta$ parameter of a transistor). For example, the transistor T1 can be a heterojunction bipolar transistor (HBT) when the transistor T1 is a BJT. According to another embodiment, when the transistor T1 is a field-effect transistor (FET), the first terminal, second terminal and control terminal of the transistor T1 are a drain terminal, a source terminal and a gate terminal respectively, and a characteristic parameter of the transistor T1 includes a transconductance (a.k.a. gm parameter of a transistor).

Figure 2A:
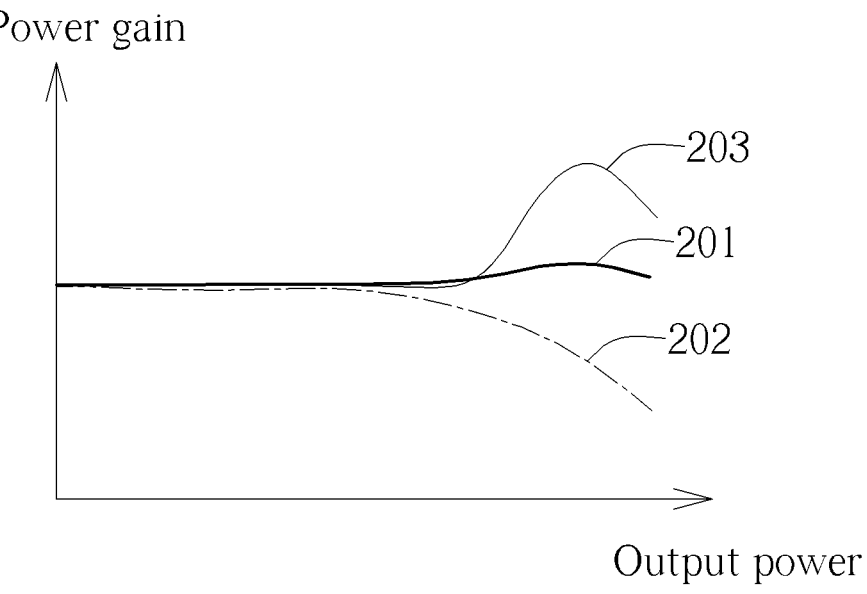
FIG. 2A and FIG. 2B illustrate the output responses of the amplifier in FIG. 1.
Figure 2B:
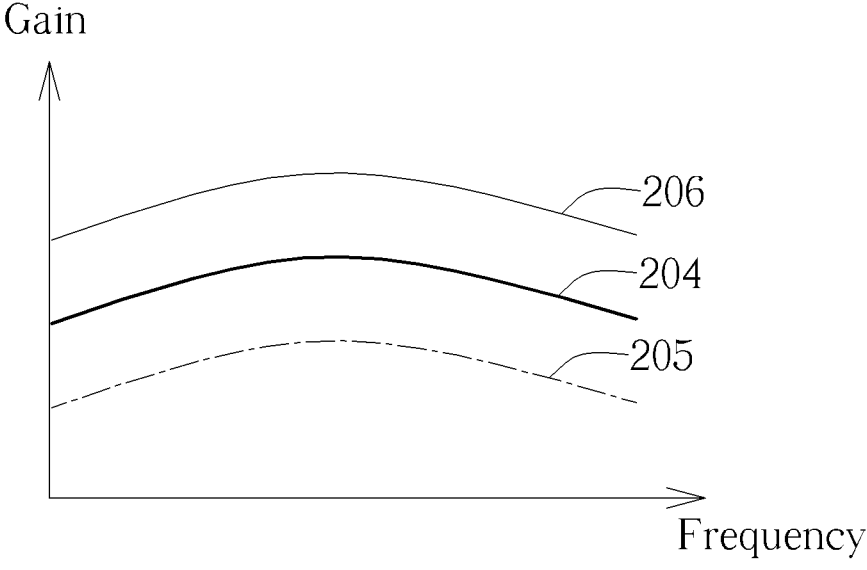

FIGS. 2A and 2B illustrate the output responses of the amplifier 110 in FIG. 1. In FIGS. 2A and 2B, the transistor T1 of the amplifier 110 is exemplified by a BJT. In FIG. 2A, the horizontal axis is corresponding to the output power of the amplifier 110, the vertical axis is corresponding to the power gain of the amplifier 110, and curves 201 to 203 respectively show the power gains of the amplifier 110. In FIG. 2B, the horizontal axis is corresponding to frequency of the input signal Si, the vertical axis is corresponding to the gain of the amplifier 110, and the curves 204 to 206 respectively show the frequency responses of the gain of the amplifier 110. As shown in FIG. 1 and FIGS. 2A and 2B, a current Ic1 flowing to the first terminal of the transistor T1 can be designed to have a proper current value, such as 160 milliamp (mA), so that the transistor T1 can operate properly. The current Ic2 can be a quiescent current to be used as a design basis when the characteristic parameter of the transistor T1 is not deviated. For example, the characteristic parameter of the transistor T1 is not deviated when the β parameter of the transistor T1 is between a lower limit β parameter and an upper limit β parameter. When the characteristic parameter of the transistor T1 is not deviated, the power gain of the amplifier 110 can be shown as the curve 201, and the frequency response of the gain can be shown as the curve 204. The characteristic parameter of the transistor T1 may deviate due to the process variation. For example, the β parameter of the transistor T1 may not be between a lower limit β parameter and an upper limit β parameter when the characteristic parameter of the transistor T1 deviates. The current Ic1 may deviate when the characteristic parameter of the transistor T1 deviates, and the performance of the amplifier 110 may hence be affected. For example, when the β parameter of the transistor T1 is smaller than a lower limit β parameter (e.g. the β parameter is only 80% of the not-deviated β parameter), the current Ic1 may decrease from 160 mA to 140 mA. In this condition, the power gain of the amplifier 110 can be shown as the curve 202, and the frequency response of the gain can be shown as the curve 205. In another example, when the β parameter of the transistor T1 is greater than an upper limit β parameter (e.g. the β parameter reaches 120% of the not-deviated β parameter), the current Ic1 may increase from 160 mA to 180 mA. In this condition, the power gain of the amplifier 110 can be shown as the curve 203, and the frequency response of the gain can be shown as the curve 206. Hence, when the β parameter of the transistor T1 deviates, the gain of the amplifier 110 may deviate correspondingly.

In FIG. 1, for reducing the abovementioned problem, the amplifier circuit 100 can further include a detector 120 and an adjustment circuit 130. The detector 120 can include a transistor T2 and an output terminal No. The transistor T2 can include a first terminal, a second terminal and a control terminal, where the first terminal can be coupled to a reference voltage terminal NV3 and the output terminal No of the detector 120, and the second terminal can be coupled to the reference voltage terminal NV2. The output terminal No can output a detection signal Vc related to a characteristic parameter of the transistor T2.

According to an embodiment, when the transistor T2 is a BJT, the first terminal, second terminal and control terminal of the transistor T2 can be a collector, an emitter and a base respectively, and the characteristic parameter of the transistor T2 can include a common-emitter current gain parameter (a.k.a. β parameter of a transistor). For example, the transistor T2 can be an HBT when the transistor T2 is a BJT. According to another embodiment, when the transistor T2 is an FET, the first terminal, second terminal and control terminal of the transistor T2 can be a drain, a source and a gate respectively, and the characteristic parameter of the transistor T2 can include a transconductance (a.k.a. gm parameter of a transistor).

As shown in FIG. 1, the detector 120 can further include a resistor R1 and a current source CS1. The resistor R1 can be coupled between the reference voltage terminal NV3 and the first terminal of the transistor T2. The current source CS1 can be coupled between the reference voltage terminal NV3 and the control terminal of the transistor T2 for providing a current Ib2. The reference voltage terminal NV3 can provide a reference voltage V3.

According to an embodiment, the detection signal Vc can be a voltage signal and be regarded as the reference voltage V3 subtracting a voltage drop on the resistor R1. The voltage drop on the resistor R1 can be substantially equal to a product of the current value of the current Ic2 and the resistance of the resistor R1, where the current Ic2 can flow to the first terminal of the transistor T2. For example, when the transistor T2 is a BJT, a ratio of the current Ic2 to the current Ib2 (expressed as Ic2/Ib2) can be positively related to the β parameter of the transistor T2. Hence, for example, the β parameter of the transistor T2 can be expressed with the following equation eq-1.

$$Vc = V3 - Ic2 \times R1 = V3 - \beta \times Ib2 \times R1. \qquad \text{(eq-1)}$$

Moreover, the signal level of the detection signal Vc can be measured, and the reference voltage V3, the resistance of the resistor R1 and the current value of the current Ib2 can be predetermined values, hence the β parameter of the transistor T2 can be deduced.

According to an embodiment, the transistors T1 and T2 can be disposed in a same integrated circuit and are of a same type, and the characteristic parameter of the transistor T2 can be related to the characteristic parameter of the transistor T1. For example, if the transistors T1 and T2 are BJTs, when the β parameter of the transistor T2 deviates due to process variation, the β parameter of the transistor T1 may also deviate, and the signal level of the detection signal Vc may deviate accordingly. In other words, the deviation of the β parameter of the transistor T2 can reflect the deviation of the β parameter of the transistor T1. For example, the β parameters of the transistors T1 and T2 can be substantially equal to one another. Hence, the detector 120 can be used to detect the characteristic parameter of the transistor T1. For the convenience of description, in the following, the transistors T1 and T2 are regarded as BJTs, and the characteristic parameters of the transistors T1 and T2 can be β parameters, which is only an example instead of limiting the scope of embodiments.

The adjustment circuit 130 can be coupled to the output terminal No of the detector 120 and the bias node Nb of the amplifier 110 for performing an adjustment operation according to the detection signal Vc.

According to embodiment, the amplifier circuit 100 can further include passive components 140 to 160 for the impedance matching of the amplifier 110. Moreover, the passive component 140 can be used to block a direct-current (DC) voltage.

Figure 3:
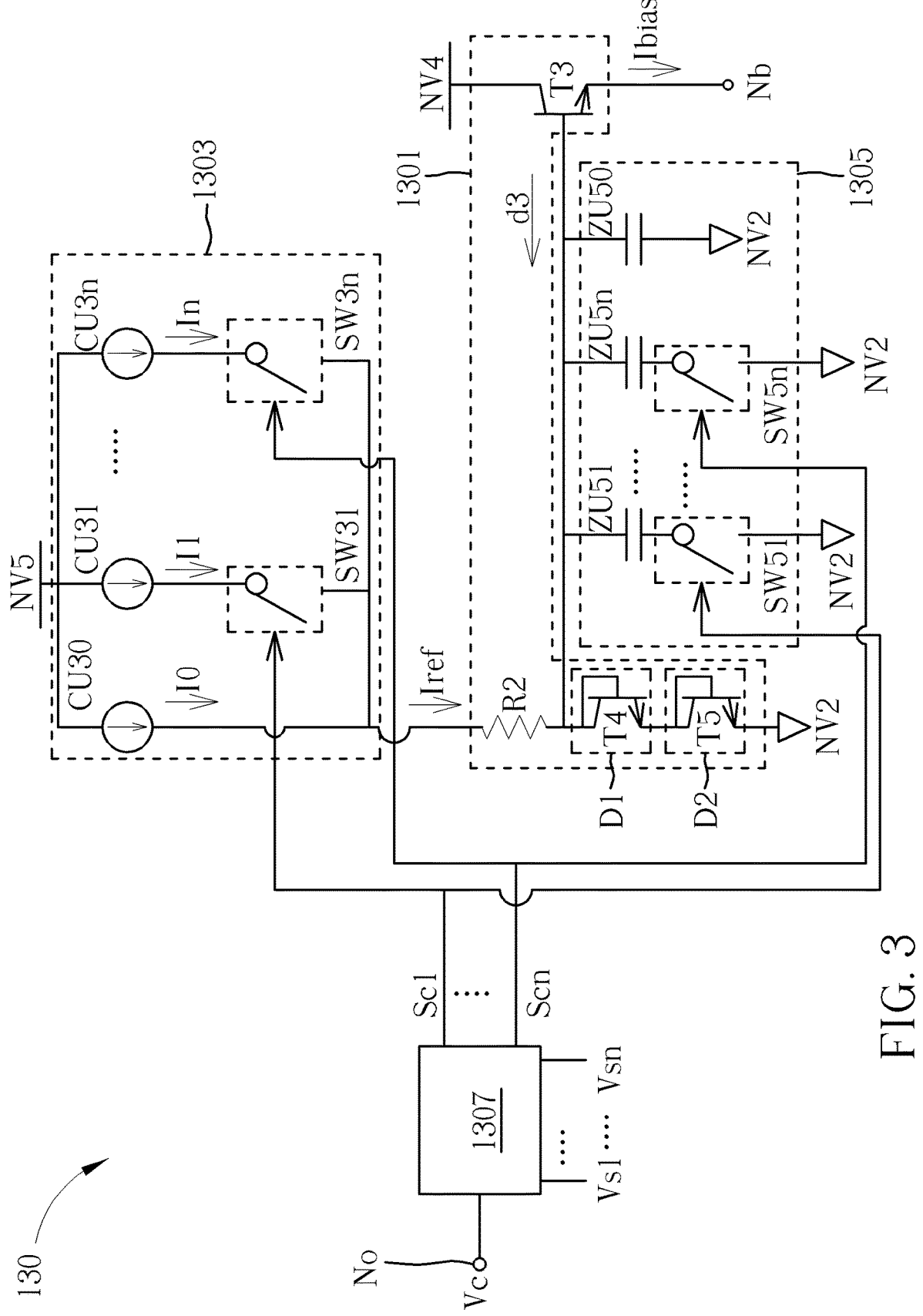
FIG. 3 illustrates the adjustment circuit in FIG. 1 according to an embodiment.

FIG. 3 illustrates the adjustment circuit 130 in FIG. 1 according to an embodiment. The adjustment circuit 130 can include a bias circuit 1301 for generating a bias current Ibias according to a reference current Iref and providing the bias current Ibias to the bias node Nb of the amplifier 110. The bias circuit 1301 can include an input terminal, an output terminal, a transistor T3, a resistor R2 and diode units D1 and D2. The input terminal of the bias circuit 1301 can receive the reference current Iref, and the output terminal of the bias circuit 1301 can output the bias current Ibias. The transistor T3 can include a first terminal, a second terminal and a control terminal, where the first terminal is coupled to a reference voltage terminal NV4, and the second terminal is coupled to the output terminal of the bias circuit 1301. The resistor R2 can include a first terminal and a second terminal, where the first terminal is coupled to the input terminal of the bias circuit 1301, and the second terminal is coupled to the control terminal of the transistor T3. The diode unit D1 can include a first terminal and a second terminal, where the first terminal is coupled to the control terminal of the transistor T3. The diode unit D2 can include a first terminal and a second terminal, where the first terminal is coupled to the second terminal of the diode unit D1, and the second terminal is coupled to the reference voltage terminal NV2. According to an embodiment, the diode unit D1 can include a transistor T4. The transistor T4 can include a first terminal, a second terminal and a control terminal, where the first terminal and the control terminal are coupled to the first terminal of the diode unit D1, and the second terminal is coupled to the second terminal of the diode unit D1. According to an embodiment, the diode unit D2 can include a transistor T5. The transistor T5 can include a first terminal, a second terminal and a control terminal, where the first terminal and the control terminal are coupled to the first terminal of the diode unit D2, and the second terminal is coupled to the second terminal of the diode unit D2.

According to an embodiment, the adjustment circuit 130 can further include a variable current source 1303 and an impedance circuit 1305. The variable current source 1303 can provide the reference current Iref according to the detection signal Vc, so that the bias circuit 1301 can adjust the bias current Ibias accordingly. In other words, the adjustment operation performed using the adjustment circuit 130 can include adjusting the reference current Iref. The impedance circuit 1305 can provide a reference impedance according to the detection signal Vc, so as to adjust the equivalent impedance looking toward the first terminal of the diode unit D1 along the direction d3 from the control terminal of the transistor T3 of the bias circuit 1301. In other words, the adjustment operation performed using the adjustment circuit 130 can include adjusting the reference impedance.

As shown in FIG. 3, the adjustment circuit 130 can further include a comparison unit 1307. The comparison unit 1307 can include an input terminal, n predetermined voltage terminals and n output terminals. The input terminal of the comparison unit 1307 can be coupled to the output terminal of the detector 120 for receiving the detection signal Vc. The n predetermined voltage terminals of the comparison unit 1307 can receive n predetermined voltages Vs1 to Vsn. The n output terminals of the comparison unit 1307 can output n comparison signals Sc1 to Scn. For example, the signal levels of the n predetermined voltages Vs1 to Vsn can be set from low to high. Hence, for example, the predetermined voltage Vs1 can be lower than the predetermined voltage Vsn. The comparison unit 1307 can compare the voltage level of the detection signal Vc with the predetermined voltages Vs1 to Vsn to generate the comparison signals Sc1 to Scn.

According to an embodiment, the variable current source 1303 can include basic current source unit CU30, n current source units CU31 to CU3n and n current switches SW31 to SW3n. The basic current source unit CU30 can provide a basic current I0 and include a first terminal and a second terminal, where the first terminal is coupled to a reference voltage terminal NV5, and the second terminal is coupled to the input terminal of the bias circuit 1301. According to an embodiment, the reference Iref can include at least the basic current I0. The current source units CU31 to CU3n can provide a first current I1 to an nth current In. Each of the current source units CU31 to CU3n can include a first terminal and a second terminal. Each of the current switches SW31 to SW3n can be controlled by a corresponding comparison signal of the comparison signals Sc1 to Scn. Each of the current switches SW31 to SW3n can include a first terminal, a second terminal and a control terminal. For example, the first terminal of the current source unit CU31 can be coupled to the reference voltage terminal NV5, the first terminal of the current switch SW31 can be coupled to the second terminal of the current source unit CU31, the control terminal of the current switch SW31 can receive the comparison signal Sc1, and so on.

According to an embodiment, the impedance circuit 1305 can include a basic impedance circuit ZU50, n impedance units ZU51 to ZU5n and n impedance switches SW51 to SW5n. The basic impedance unit ZU50 can provide a basic impedance and include a first terminal and a second terminal, where the first terminal can be coupled to the control terminal of the transistor T3, and the second terminal can be coupled to the reference voltage terminal NV2. The reference impedance provided by the impedance circuit 1305 can include at least the basic impedance. The impedance units ZU51 to ZU5n can respectively provide a first impedance to an nth impedance. Each of the impedance units ZU51 to ZU5n can include a first terminal and a second terminal. Each of the impedance switches SW51 to SW5n can be controlled by a corresponding signal of the n comparison signals Sc1 to Scn, and include a first terminal, a second terminal and a control terminal. For example, the first terminal of the impedance unit ZU51 can be coupled to the control terminal of the transistor T3, the first terminal of the impedance switch SW51 can be coupled to the second terminal of the impedance unit ZU51, the second terminal of the impedance switch SW51 can be coupled to reference voltage terminal NV2, the control terminal of the impedance switch SW51 can receive the comparison signal Sc1, and so on. In FIG. 3, n is a positive integer larger than 1. According to an embodiment, each of the basic impedance unit ZU50 and the impedance units ZU51 to ZU5n can include a resistor, a capacitor, an inductor or any combination of the three components. In FIG. 3, each of the basic impedance unit ZU50 and the impedance units ZU51 to ZU5n is shown as a capacitor, and this is an example instead of limiting the scope of embodiments.

Figure 4A:
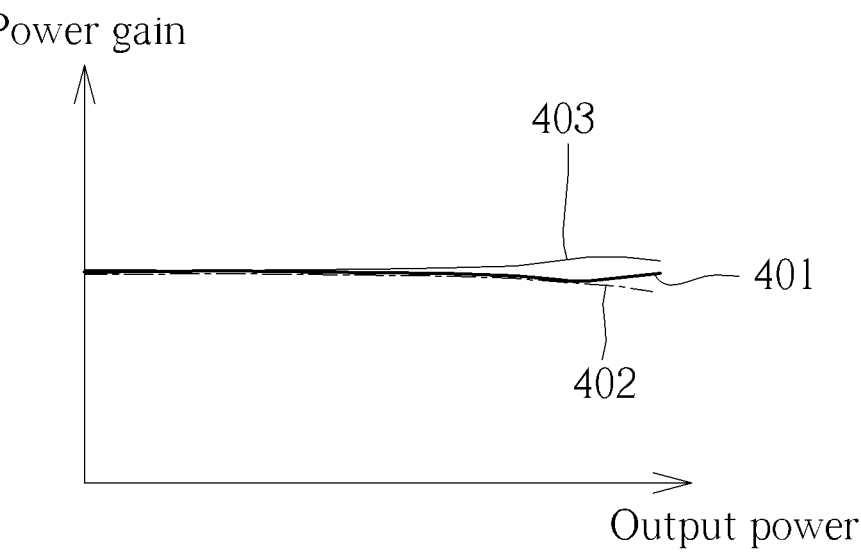
FIG. 4A and FIG. 4B illustrate the output responses of the amplifier circuit in FIG. 1.
Figure 4B:
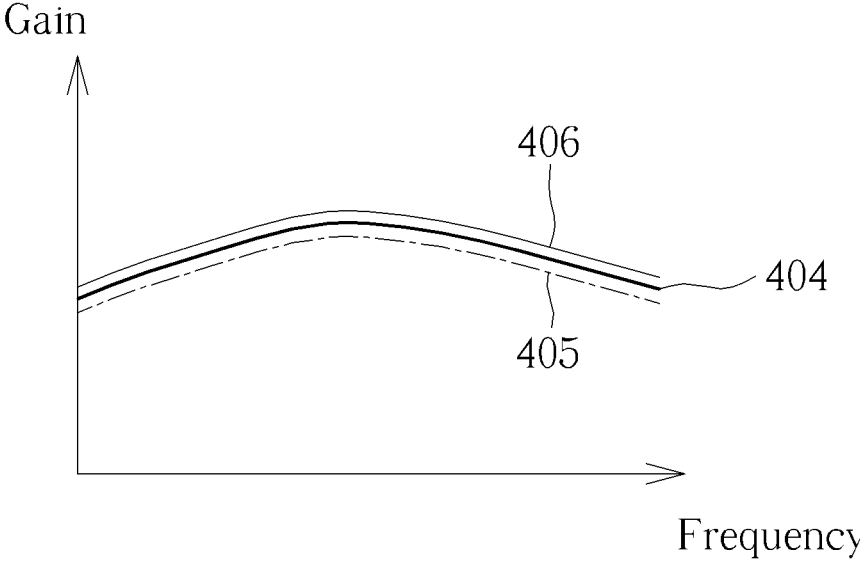

FIGS. 4A and 4B illustrate the output responses of the amplifier circuit 100 in FIG. 1. In FIG. 4A, the horizontal axis is corresponding to the output power of the amplifier circuit 100, the vertical axis is corresponding to the power gain of the amplifier circuit 100, and curves 401 to 403 respectively show the power gains of the amplifier circuit 100. In FIG. 4B, the horizontal axis is corresponding to frequency of the input signal Si, the vertical axis is corresponding to the gain of the amplifier circuit 100, and the curves 404 to 406 respectively show the frequency responses of the gain of the amplifier 110. In FIG. 1, FIG. 3, FIG. 4A and FIG. 4B, for the convenience of description, n of FIG. 3 can be 2 as an example instead of limiting scope of embodiments.

According to an embodiment, when the signal level of the detection signal Vc meets an nth condition, it can mean that the β parameters of the transistors T1 and T2 are between a lower limit β parameter and an upper limit β parameter, and the current Ic1 can hence be kept stable. For example, the nth condition can include that the voltage level of the detection signal Vc is between the predetermined voltages Vs1 and Vsn. The comparison unit 1307 can output a comparison signal Sc1 with a disabling signal level and a comparison signal Scn with an enabling signal level to turn off the current switch SW31 and the impedance switch SW51 and turn on the current switch SW3n and the impedance switch SW5n. The variable current source 1303 can hence provide the stable reference current Iref, so that the bias circuit 1301 can generate the stable bias current Ibias accordingly, where the reference current Iref can include the basic current I0 generated by the basic current source unit CU30 and the nth current In generated by the current source unit CU3n. In this way, the current Ic1 can be kept to have a proper current value (e.g. 160 mA), so that the amplifier circuit 100 can have a better performance. Moreover, the impedance circuit 1305 can provide a proper reference impedance including the basic impedance provided by the basic impedance unit ZU50 and the nth impedance provided by the impedance unit ZU5n, so that the equivalent impedance looking toward the first terminal of the diode unit D1 along the direction d3 from the control terminal of the transistor T3 can be roughly kept, and gain deviation of the amplifier circuit 100 can be reduced or prevented. In this condition, the power gain of the amplifier circuit 100 can be shown as the curve 401, and the frequency response of the gain of the amplifier circuit 100 can be shown as the curve 404. When the signal level of the detection signal Vc meets an (n−1)th condition, it can mean that the β parameters of the transistors T1 and T2 are lower than the lower limit β parameter, and the current Ic1 can hence decrease (e.g. from 160 mA to 140 mA). For example, the (n−1)th condition can include that the voltage level of the detection signal Vc is greater than the predetermined voltage Vsn. Hence, the comparison unit 1307 can output comparison signals Sc1 to Scn with an enabling signal level to turn on the current switch SW31 to SW3n and the impedance switch SW51 to SW5n. The variable current source 1303 can hence increase the reference current Iref, so that the bias circuit 1301 can increase the bias current Ibias accordingly, where the reference current Iref can include the basic current I0, the first current I1 and the nth current In generated by the basic current source unit CU30, the first current source unit CU31 and the nth current source unit CU3n. In this way, the current Ic1 can be increased to a larger current value (e.g. 150 mA) to approach the current Ic1 (e.g. 160 mA) corresponding to the not-deviated β parameter of the transistor T1, so that the amplifier circuit 100 can have a better performance. Moreover, the impedance circuit 1305 can provide a greater reference impedance including the basic impedance provided by the basic impedance unit ZU50, the first impedance provided by the impedance unit ZU51 and the nth impedance provided by the impedance unit ZU5n, so that the equivalent impedance looking toward the first terminal of the diode unit D1 along the direction d3 from the control terminal of the transistor T3 can be increased, and gain deviation of the amplifier circuit 100 can be reduced. In this condition, the power gain of the amplifier circuit 100 can be shown as the curve 402, and the frequency response of the gain of the amplifier circuit 100 can be shown as the curve 405. When the signal level of the detection signal Vc meets an (n+1)th condition, it can mean that the β parameters of the transistors T1 and T2 are greater than the upper limit β parameter, and the current Ic1 can hence increase (e.g. from 160 mA to 180 mA). For example, the (n+1)th condition can be that the voltage level of the detection signal Vc is lower than the predetermined voltage Vsn. Hence, the comparison unit 1307 can output comparison signals Sc1 to Scn with a disabling signal level to turn off the current switch SW31 to SW3n and the impedance switch SW51 to SW5n. The variable current source 1303 can hence decrease the reference current Iref, so that the bias circuit 1301 can decrease the bias current Ibias accordingly, where the reference current Iref can include the basic current I0 generated by the basic current source unit CU30. In this way, the current Ic1 can be decreased to a smaller current value (e.g. 170 mA) to approach the current Ic1 (e.g. 160 mA) corresponding to the not-deviated β parameter of the transistor T1, so that the amplifier circuit 100 can have a better performance. Moreover, the impedance circuit 1305 can provide a smaller reference impedance including the basic impedance provided by the basic impedance unit ZU50, so that the equivalent impedance looking toward the first terminal of the diode unit D1 along the direction d3 from the control terminal of the transistor T3 can be decreased, and gain deviation of the amplifier circuit 100 can be reduced. In this condition, the power gain of the amplifier circuit 100 can be shown as the curve 403, and the frequency response of the gain of the amplifier circuit 100 can be shown as the curve 406. In other words, when the β parameter of the transistor T1 deviates, the variable current source 1303 can be used to compensate the change of the current Ic1 for the curves 405 and 406 to approach the curve 404. Moreover, the impedance circuit 1305 can be adjusted for the curves 402 and 403 to approach the curve 401. According to an embodiment, the impedance circuit 1305 can be used to reduce the variation range of the power gain of the amplifier circuit 100 when the output power is a high power, so that the curves 402 and 403 can approach the curve 401. According to an embodiment, n is a positive integer, n+1>n>n−1≥, and the said (n−1)th condition, nth condition and (n+1)th condition can be different from one another.

Figure 5:
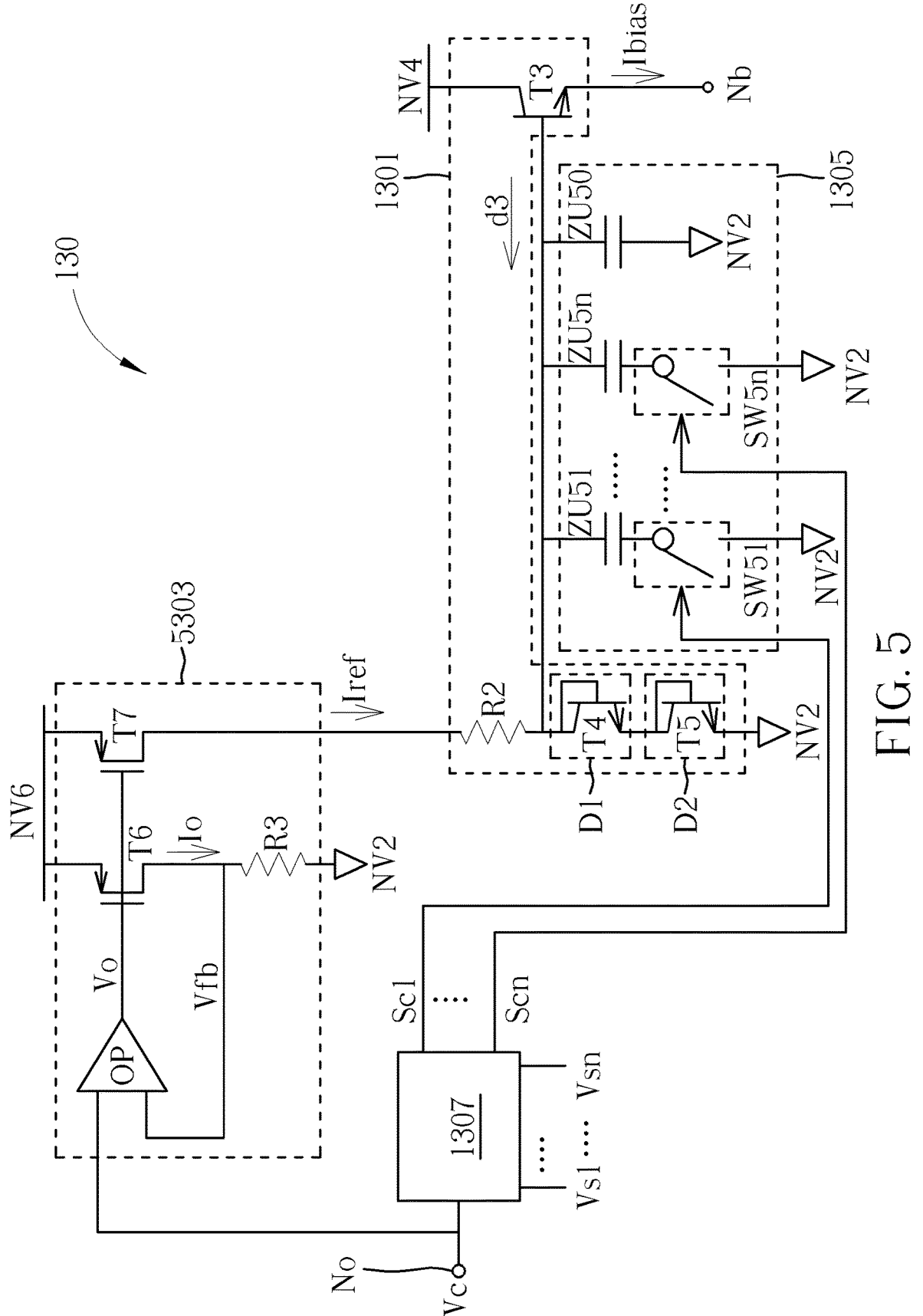
FIG. 5 illustrates the adjustment circuit in FIG. 1 according to another embodiment.

FIG. 5 illustrates the adjustment circuit 130 in FIG. 1 according to another embodiment. FIG. 5 can be similar to FIG. 3, the difference is in the structure of the variable current source, and the similarities are not repeatedly described. As shown in FIG. 5, the variable current source 5303 can include transistors T6 and T7, a resistor R3 and an operational amplifier OP.

The transistor T6 can include a first terminal, a second terminal and a control terminal, where the first terminal can be coupled to a sixth reference voltage NV6. The resistor R3 can include a first terminal and a second terminal, where the first terminal can be coupled to the second terminal of the transistor T6, and the second terminal can be coupled to the reference voltage terminal NV2. The operational amplifier OP can include a first input terminal, a second input terminal and an output terminal, where the first input terminal can be coupled to the output terminal No of the detector 120 for receiving the detection signal Vc, the second input terminal can be coupled to the second terminal of the transistor T6 for receiving a feedback voltage Vfb, and the output terminal can be coupled to the control terminal of the transistor T6 for outputting an output voltage Vo. The transistor T7 can include a first terminal, a second terminal and a control terminal, where the first terminal can be coupled to the reference voltage terminal NV6, the second terminal can be coupled to the input terminal of the bias circuit 1301, and the control terminal can be coupled to the control terminal of the transistor T6.

According to an embodiment, the variable current source 5303 can provide the reference current Iref according to the detection signal Vc, so that the bias circuit 1301 can adjust the bias current Ibias accordingly. In other words, the adjustment operation performed using the adjustment circuit 130 can include adjusting the reference current Iref. Further, the operational amplifier OP can generate the output voltage Vo according to the detection signal Vc and the feedback voltage Vfb, so that the transistor T6 can adjust the feedback voltage Vfb and the output current Io accordingly. Moreover, the transistors T6 and T7 can form a current mirror structure to generate the reference current Iref by mirroring the output current Io. For example, in FIG. 1, FIG. 4A, FIG. 4B and FIG. 5, when the detection signal meets an nth condition, it can mean that the β parameters of the transistors T1 and T2 are between a lower limit β parameter and an upper limit β parameter, and the current Ic1 can hence be kept stable. For example, the nth condition can include that the voltage level of the detection signal Vc is substantially equal to the feedback voltage Vfb. The output voltage Vo generated by the operational amplifier OP can maintain the feedback voltage Vfb and the output current Io to be predetermined values, and the transistor T7 can generate the reference current Iref according to the output current Io, so that the bias circuit 1301 can keep the bias current Ibias stable. In this way, the current Ic1 can be kept to have a proper current value (e.g. 160 mA), so that the amplifier circuit 100 can have a better performance, and the frequency response of the gain of the amplifier circuit 100 can be shown as the curve 404. When the detection signal meets an (n−1)th condition, it can mean that the β parameters of the transistors T1 and T2 are lower than the lower limit β parameter, and the current Ic1 can hence decrease (e.g. from 160 mA to 140 mA). For example, the (n−1)th condition can include that the voltage level of the detection signal Vc is substantially higher than the feedback voltage Vfb. The output voltage Vo generated by the operational amplifier OP can control the transistor T6 to increase the feedback voltage Vfb and the output current Io, and the transistor T7 can increase the reference current Iref accordingly. In this way, the current Ic1 can be increased to a larger current value (e.g. 150 mA) to approach the current Ic1 (e.g. 160 mA) corresponding to the not-deviated β parameter of the transistor T1, so that the amplifier circuit 100 can have a better performance, and the frequency response of the gain of the amplifier circuit 100 can be shown as the curve 405. When the detection signal meets an (n+1)th condition, it can mean that the β parameters of the transistors T1 and T2 are greater than the lower limit β parameter, and the current Ic1 can hence increase (e.g. from 160 mA to 180 mA). For example, the (n+1)th condition can include that the voltage level of the detection signal Vc is substantially lower than the feedback voltage Vfb. The output voltage Vo generated by the operational amplifier OP can control the transistor T6 to decrease the feedback voltage Vfb and the output current Io, and the transistor T7 can decrease the reference current Iref accordingly. In this way, the current Ic1 can be decreased to a smaller current value (e.g. 170 mA) to approach the current Ic1 (e.g. 160 mA) corresponding to the not-deviated β parameter of the transistor T1, so that the amplifier circuit 100 can have a better performance, and the frequency response of the gain of the amplifier circuit 100 can be shown as the curve 406. In other words, when the β parameter of the transistor T1 deviates, the variable current source 5303 can be used to compensate the change of the current Ic1 for the curves 405 and 406 to approach the curve 404. According to an embodiment, n is a positive integer, n+1>n>n−1≥1, and the said (n−1)th condition, nth condition and (n+1)th condition can be different from one another.

Figure 6:
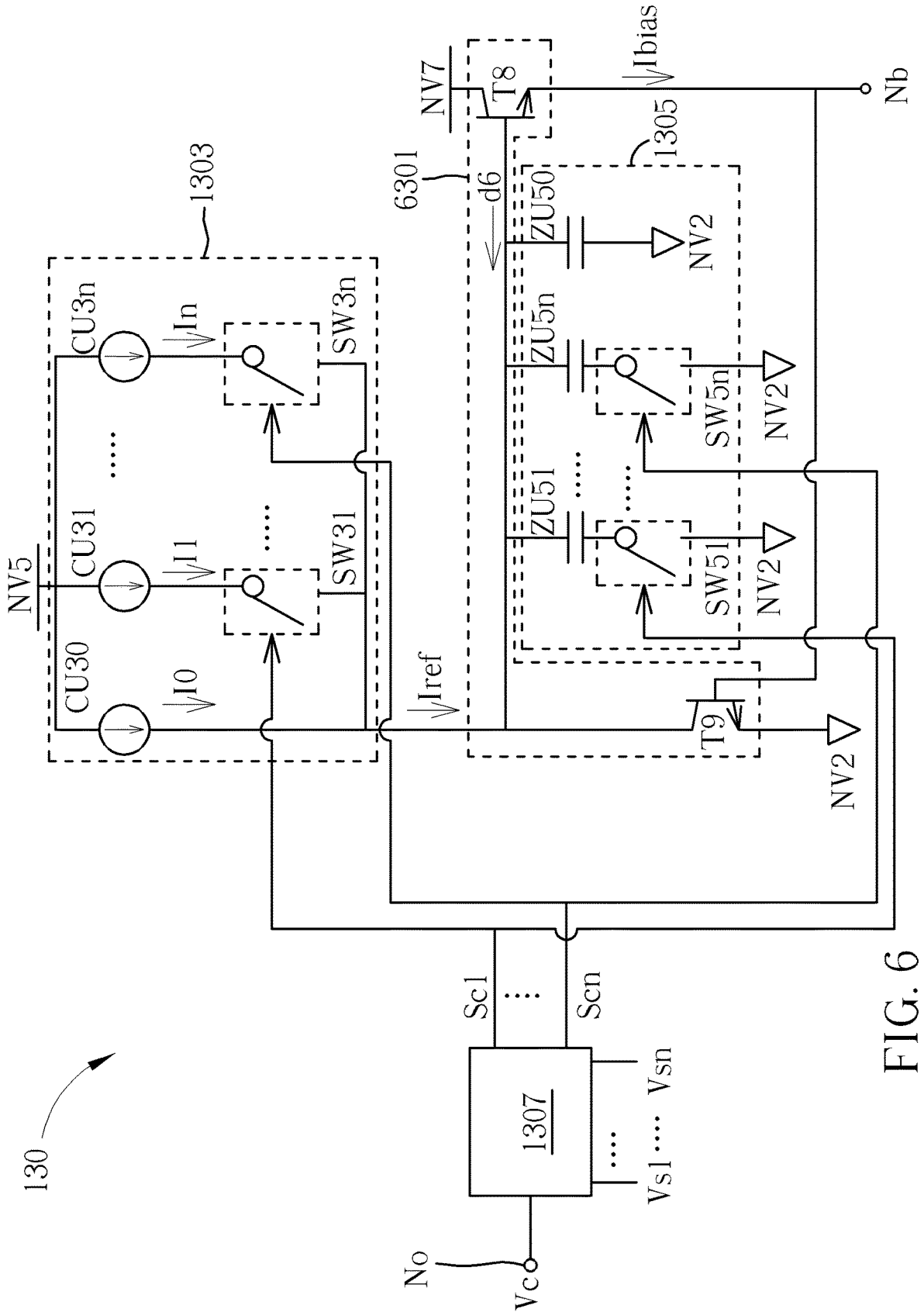
FIG. 6 illustrates the adjustment circuit in FIG. 1 according to another embodiment.

FIG. 6 illustrates the adjustment circuit 130 of the amplifier circuit in FIG. 1 according to another embodiment. FIG. 6 can be similar to FIG. 3, the differences are in the structure of the bias circuit and the relationship of the bias circuit and the impedance circuit, and the similarities are not repeatedly described. In FIG. 6, the bias circuit 6301 can include an input terminal, an output terminal and the transistors T8 and T9. The input terminal can receive the reference current Iref, and the output terminal can output the bias current Ibias. The transistor T8 can include a first terminal, a second terminal and a control terminal, where the first terminal can be coupled to a reference voltage terminal NV7, and the second terminal can be coupled to the output terminal of the bias circuit 6301. The transistor T9 can include a first terminal, a second terminal and a control terminal, where the first terminal can be coupled to the input terminal of the bias circuit 6301 and the control terminal of the transistor T8, the second terminal can be coupled to the reference voltage terminal NV2, and the control terminal can be coupled to the second terminal of the transistor T8. The bias circuit 6301 can generate the bias current Ibias according to the reference current Iref, and provide the bias current Ibias to the bias node Nb of the amplifier 110.

The impedance circuit 1305 can provide a reference impedance according to the detection signal Vc, so as to adjust the equivalent impedance looking toward the first terminal of the transistor T9 along the direction d6 from the control terminal of the transistor T8 of the bias circuit 6301. According to an embodiment, the impedance circuit 1305 can include a basic impedance circuit ZU50, n impedance units ZU51 to ZU5n and n impedance switches SW51 to SW5n. The basic impedance unit ZU50 can provide a basic impedance and include a first terminal and a second terminal, where the first terminal can be coupled to the control terminal of the transistor T8, and the second terminal can be coupled to the reference voltage terminal NV2. The reference impedance provided by the impedance circuit 1305 can include at least the basic impedance. The impedance units ZU51 to ZU5n can respectively provide a first impedance to an nth impedance. Each of the impedance units ZU51 to ZU5n can include a first terminal and a second terminal. Each of the impedance switches SW51 to SW5n can be controlled by a corresponding signal of the n comparison signals Sc1 to Scn, and include a first terminal, a second terminal and a control terminal. For example, the first terminal of the impedance unit ZU51 can be coupled to the control terminal of the transistor T8, the first terminal of the impedance switch SW51 can be coupled to the second terminal of the impedance unit ZU51, the second terminal of the impedance switch SW51 can be coupled to reference voltage terminal NV2, the control terminal of the impedance switch SW51 can receive the comparison signal Sc1, and so on. In FIG. 6, n is a positive integer larger than 1. According to an embodiment, each of the basic impedance unit ZU50 and the impedance units ZU51 to ZU5n can include a resistor, a capacitor, an inductor or any combination of the three components. In FIG. 6, each of the basic impedance unit ZU50 and the impedance units ZU51 to ZU5n is shown as a capacitor, and this is an example instead of limiting the scope of embodiments.

Figure 7:
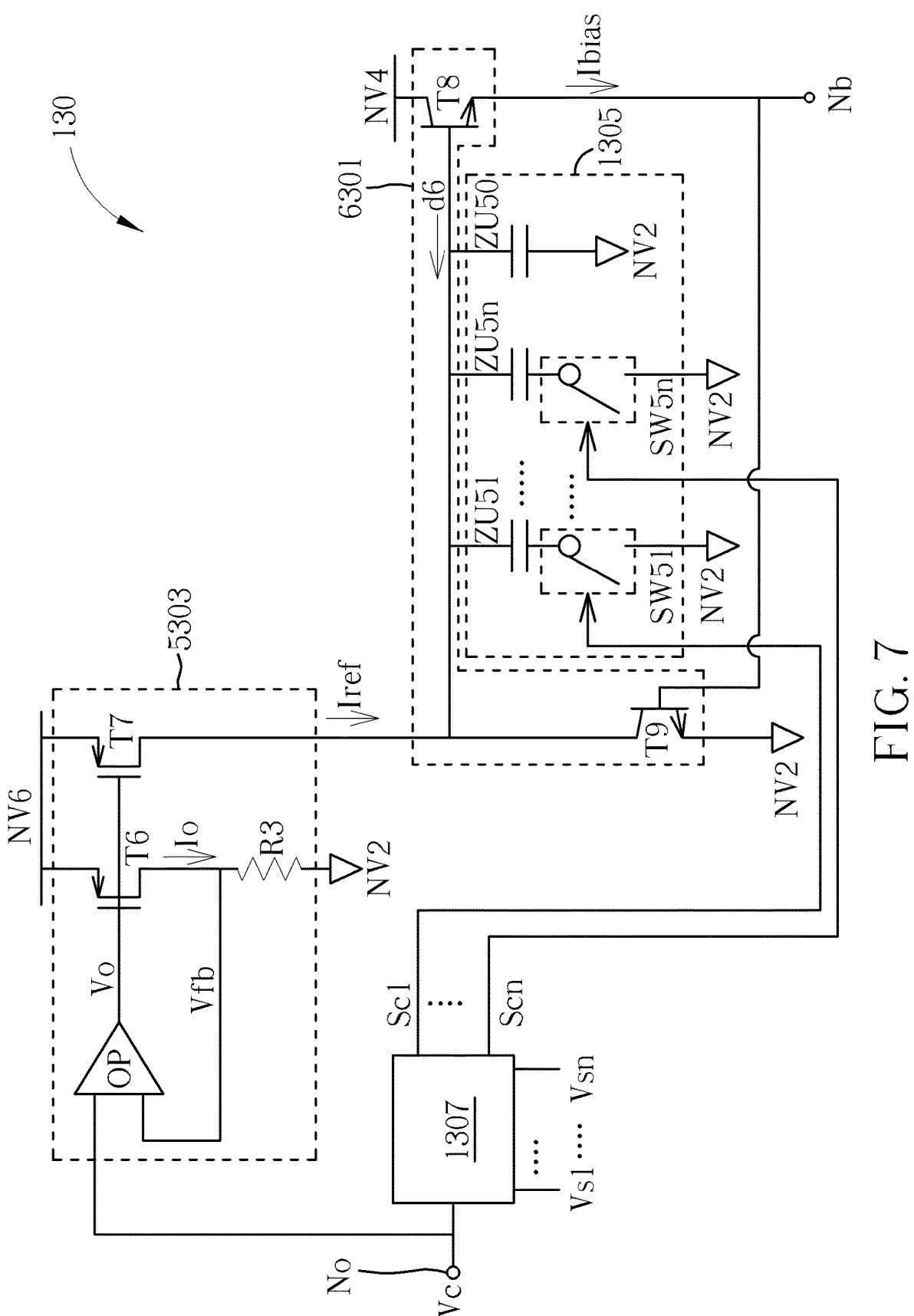
FIG. 7 illustrates the adjustment circuit in FIG. 1 according to another embodiment.

FIG. 7 illustrates the adjustment circuit 130 in FIG. 1 according to another embodiment. In FIG. 7, the impedance circuit 1305, the comparison unit 1307 and the bias circuit 6301 can be similar to that in FIG. 5, so it is not repeatedly described.

Figure 8:
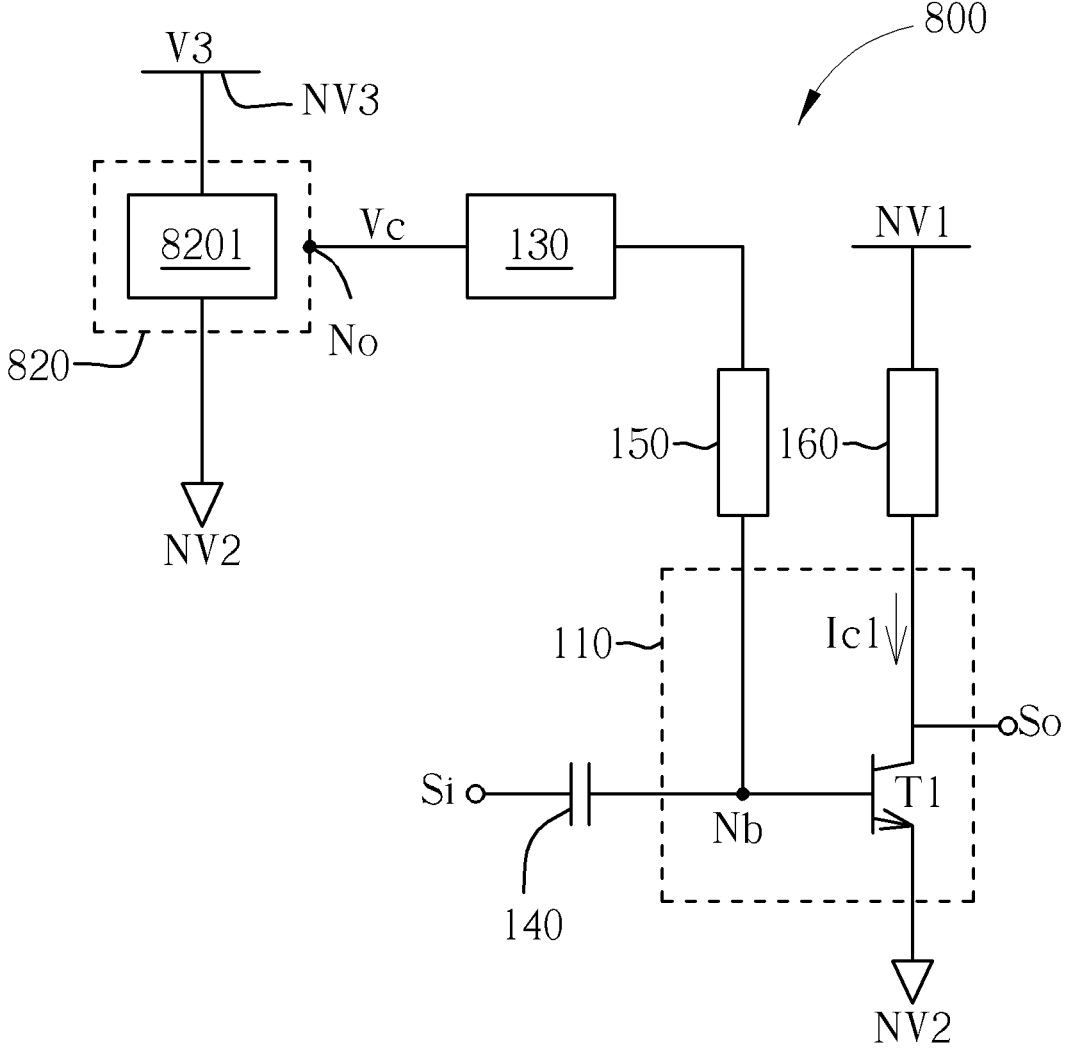
FIG. 8 illustrates an amplifier circuit according to another embodiment.

FIG. 8 illustrates an amplifier circuit 800 according to another embodiment. FIG. 8 is similar to FIG. 1, the difference lies in the structure of the detector, and the similarities are not repeatedly described. In FIG. 8, the detector 820 can include a semiconductor element 8021 and an output terminal No. The semiconductor element 8021 can include a first terminal and a second terminal, where the first terminal can be coupled to the reference voltage terminal NV3, and the second terminal can be coupled to the reference voltage terminal NV2. For example, the semiconductor element 8021 can include an active component (e.g. any of BJT and FET) and/or passive component (e.g. any of resistor and diode). The output terminal No can output the detection signal Vc related to a characteristic parameter of the semiconductor element 8201.

According to an embodiment, the transistor T1 and the semiconductor element 8201 can be disposed in a same integrated circuit. The transistor T1 and the semiconductor element 8201 can include at least one same semiconductor layer, and the characteristic parameter of the semiconductor element can be related to the characteristic parameter of the transistor T1. The at least one same semiconductor layer can be related to the characteristic parameter of the transistor T1. For example, when the transistor T1 and the semiconductor element 8201 are both formed with BJT, and the β parameter of the transistor T1 deviates due to process variation, the β parameter of the semiconductor element 8201 can also deviate, and the signal level of the detection signal Vc may change accordingly. In other words, the change of the β parameter of the semiconductor element 8201 can reflect the change of the β parameter of the transistor T1. According to an embodiment, the β parameter of the semiconductor element 8201 can be substantially equal to that of the transistor T1. Hence, the detector 820 can be used to detect the characteristic parameter of the transistor T1.

The adjustment circuit 130 in FIG. 8 can be implemented using the adjustment circuit 130 in one of FIG. 3 and FIG. 5 to FIG. 7, so it is not repeatedly described.

In summary, by using the amplifier circuit provided by an embodiment, the change of the characteristic parameter of the semiconductor element or transistor in the detector can reflect the change of the characteristic parameter of the transistor of the amplifier, and the adjustment operation can be performed accordingly to improve the performance of the amplifier circuit and reduce the gain deviation of the amplifier circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier circuit comprising:
an amplifier comprising a bias node, and a first transistor comprising a first terminal coupled to a first reference voltage terminal, a second terminal coupled to a second reference voltage terminal, and a control terminal coupled to the bias node of the amplifier;
a detector comprising a second transistor, and an output terminal configured to output a detection signal related to a characteristic parameter of the second transistor; and the second transistor comprising a first terminal coupled to a third reference voltage terminal and the output terminal of the detector, and a second terminal coupled to the second reference voltage terminal; and
an adjustment circuit coupled to the output terminal of the detector and the bias node of the amplifier, configured to perform an adjustment operation according to the detection signal, and comprising a first bias circuit configured to generate a bias current according to a reference current and provide the bias current to the bias node of the amplifier, and a first variable current source configured to provide the reference current according to the detection signal, wherein the adjustment operation comprises adjusting the reference current;
wherein the first transistor and the second transistor are disposed in a same integrated circuit, the first transistor and the second transistor are of a same type, and the characteristic parameter of the second transistor is related to a characteristic parameter of the first transistor.

2. The amplifier circuit of claim 1, wherein the adjustment circuit further comprises:
a first impedance circuit configured to provide a reference impedance according to the detection signal;
wherein the adjustment operation comprises adjusting the reference impedance.

3. The amplifier circuit of claim 2, wherein:
responsive to a determination that a signal level of the detection signal meets a first condition, the first variable current source increases the reference current to make the first bias circuit increase the bias current;
responsive to a determination that the signal level of the detection signal meets a second condition, the first variable current source decreases the reference current to make the first bias circuit decrease the bias current; and
the first condition is different from the second condition.

4. The amplifier circuit of claim 3, wherein:
responsive to the determination that the signal level of the detection signal meets the first condition, the first impedance circuit increases the reference impedance; and
responsive to the determination that the signal level of the detection signal meets the second condition, the first impedance circuit decreases the reference impedance.

5. An amplifier circuit, comprising:
an amplifier comprising a bias node, and a first transistor comprising a first terminal coupled to a first reference voltage terminal, a second terminal coupled to a second reference voltage terminal, and a control terminal coupled to the bias node of the amplifier;
a detector comprising a second transistor, and an output terminal configured to output a detection signal related to a characteristic parameter of the second transistor; and the second transistor comprising a first terminal coupled to a third reference voltage terminal and the output terminal of the detector, and a second terminal coupled to the second reference voltage terminal; and
an adjustment circuit coupled to the output terminal of the detector and the bias node of the amplifier, configured to perform an adjustment operation according to the detection signal, and comprising at least one of a second bias circuit and a third bias circuit;
wherein the first transistor and the second transistor are disposed in a same integrated circuit, the first transistor and the second transistor are of a same type, and the characteristic parameter of the second transistor is related to a characteristic parameter of the first transistor;
wherein the second bias circuit comprises:
an input terminal configured to receive a reference current;
an output terminal configured to output a bias current;
a third transistor comprising a first terminal coupled to a fourth reference voltage terminal, a second terminal coupled to the output terminal of the second bias circuit, and a control terminal;

a first resistor comprising a first terminal coupled to the input terminal of the second bias circuit, and a second terminal coupled to the control terminal of the third transistor;

a first diode unit comprising a first terminal coupled to the control terminal of the third transistor, and a second terminal; and a second diode unit comprising a first terminal coupled to the second terminal of the first diode unit, and a second terminal coupled to the second reference voltage terminal; and wherein the third bias circuit comprises:

an input terminal configured to receive a reference current;

an output terminal configured to output a bias current;

a sixth transistor comprising a first terminal coupled to a seventh reference voltage terminal, a second terminal coupled to the output terminal of the third bias circuit, and a control terminal; and a seventh transistor comprising a first terminal coupled to the input terminal of the third bias circuit and the control terminal of the sixth transistor, a second terminal coupled to the second reference voltage terminal, and a control terminal coupled to the second terminal of the sixth transistor.

6. The amplifier circuit of claim 5, wherein the adjustment circuit further comprises a second impedance circuit comprising:

a first basic impedance unit configured to provide a basic impedance, and comprising a first terminal coupled to the control terminal of the third transistor, and a second terminal coupled to the second reference voltage terminal;

n first impedance units, wherein an ith first impedance unit of the n first impedance units is configured to provide an ith impedance, and comprises a first terminal coupled to the control terminal of the third transistor, and a second terminal; and n first impedance switches, wherein an ith first impedance switch of the n first impedance switches comprises a first terminal coupled to the second terminal of the ith first impedance unit, a second terminal coupled to the second reference voltage terminal, and a control terminal configured to receive an ith first comparison signal of n first comparison signals;

wherein n and i are positive integers, n>1, and 0<i≤n.

7. The amplifier circuit of claim 6, wherein the adjustment circuit further comprises a second variable current source comprising:

a first basic current source unit configured to provide a basic current, and comprising a first terminal coupled to a fifth reference voltage terminal, and a second terminal coupled to the input terminal of the second bias circuit;

n first current source units, wherein a jth first current source unit of the n first current source units is configured to provide a jth current, and comprises a first terminal coupled to the fifth reference voltage terminal, and a second terminal; and n first current switches, wherein a jth first current switch of the n first current switches comprises a first terminal coupled to the second terminal of the jth first current source unit, a second terminal coupled to the input terminal of the second bias circuit, and a control terminal configured to receive a jth first comparison signal of the n first comparison signals;

wherein j is a positive integer, and 0<j≤n.

8. The amplifier circuit of claim 7, wherein the adjustment circuit further comprises a first comparison unit comprising:

an input terminal coupled to the output terminal of the detector, and configured to receive the detection signal;

n predetermined voltage terminals configured to receive n predetermined voltages; and n output terminals configured to output the n first comparison signals.

9. The amplifier circuit of claim 6, wherein the adjustment circuit further comprises a third variable current source comprising:

a fourth transistor comprising a first terminal coupled to a sixth reference voltage terminal, a second terminal, and a control terminal;

a second resistor comprising a first terminal coupled to the second terminal of the fourth transistor, and a second terminal coupled to the second reference voltage terminal;

a first operational amplifier comprising a first input terminal coupled to the output terminal of the detector, a second input terminal coupled to the second terminal of the fourth transistor, and an output terminal coupled to the control terminal of the fourth transistor; and a fifth transistor comprising a first terminal coupled to the sixth reference voltage terminal, a second terminal coupled to the input terminal of the second bias circuit, and a control terminal coupled to the control terminal of the fourth transistor.

10. The amplifier circuit of claim 5, wherein the adjustment circuit further comprises a third impedance circuit comprising:

a second basic impedance unit configured to provide a basic impedance, and comprising a first terminal coupled to the control terminal of the sixth transistor, and a second terminal coupled to the second reference voltage terminal;

n second impedance units, wherein an ith second impedance unit of the n second impedance units is configured to provide an ith impedance, and comprises a first terminal coupled to the control terminal of the sixth transistor, and a second terminal; and n second impedance switches, wherein an ith second impedance switch of the n second impedance switches comprises a first terminal coupled to the second terminal of the ith second impedance unit, a second terminal coupled to the second reference voltage terminal, and a control terminal configured to receive an ith second comparison signal of n second comparison signals;

wherein n and i are positive integers, n>1, and 0<i≤n.

11. The amplifier circuit of claim 10, wherein the adjustment circuit further comprises a fourth variable current source, comprising:

a second basic current source unit configured to provide a basic current, and comprising a first terminal coupled to an eighth reference voltage terminal, and a second terminal coupled to the input terminal of the third bias circuit;

n second current source units, wherein a jth second current source unit of the n second current source units is configured to provide a jth current, and comprises a first terminal coupled to the eighth reference voltage terminal, and a second terminal; and n second current switches, wherein a jth second current switch of the n second current switches comprises a first terminal coupled to the second terminal of the jth second current source unit, a second terminal coupled to the input terminal of the third bias circuit, and a control terminal configured to receive a jth second comparison signal of the n second comparison signals; wherein j is a positive integer, and $0<j\le n$.

12. The amplifier circuit of claim 11, wherein the adjustment circuit further comprises a second comparison unit comprising:

an input terminal coupled to the output terminal of the detector, and configured to receive the detection signal;

n predetermined voltage terminals configured to receive n predetermined voltages; and n output terminals configured to output the n second comparison signals.

13. The amplifier circuit of claim 10, wherein the adjustment circuit further comprises a fifth variable current source comprising:

an eighth transistor comprising a first terminal coupled to a ninth reference voltage terminal, a second terminal, and a control terminal;

a third resistor comprising a first terminal coupled to the second terminal of the eighth transistor, and a second terminal coupled to the second reference voltage terminal;

a second operational amplifier comprising a first input terminal coupled to the output terminal of the detector, a second input terminal coupled to the second terminal of the eighth transistor, and an output terminal coupled to the control terminal of the eighth transistor; and a ninth transistor comprising a first terminal coupled to the ninth reference voltage terminal, a second terminal coupled to the input terminal of the third bias circuit, and a control terminal coupled to the control terminal of the eighth transistor.

14. The amplifier circuit of claim 1, wherein the first transistor and the second transistor are bipolar junction transistors, the characteristic parameter of the first transistor and the characteristic parameter of the second transistor are common-emitter current gain parameters.

15. An amplifier circuit, comprising:

an amplifier comprising a bias node, and a first transistor comprising a first terminal coupled to a first reference voltage terminal, a second terminal coupled to a second reference voltage terminal, and a control terminal coupled to the bias node of the amplifier;

a detector comprising a second transistor, a fourth resistor, a first current source, and an output terminal configured to output a detection signal related to a characteristic parameter of the second transistor; and the second transistor comprising a first terminal coupled to a third reference voltage terminal and the output terminal of the detector, a second terminal coupled to the second reference voltage terminal, and a control terminal; and an adjustment circuit coupled to the output terminal of the detector and the bias node of the amplifier, and configured to perform an adjustment operation according to the detection signal;

wherein the first transistor and the second transistor are disposed in a same integrated circuit, the first transistor and the second transistor are of a same type, and the characteristic parameter of the second transistor is related to a characteristic parameter of the first transistor;

wherein:

the fourth resistor of the detector is coupled to a tenth reference voltage terminal and the first terminal of the second transistor; and the first current source of the detector is coupled between the tenth reference voltage terminal and the control terminal of the second transistor.

* * * * *